United States Patent
Kwon

(10) Patent No.: US 9,728,574 B2
(45) Date of Patent: Aug. 8, 2017

(54) CMOS IMAGE SENSOR WITH SHARED SENSING NODE

(71) Applicants: ASML Netherlands B.V., Veldhoven (NL); CARL ZEISS AG, Oberkochen (DE)

(72) Inventor: Oh-Bong Kwon, Cheongju-Si (KR)

(73) Assignees: ASML NETHERLANDS B.V., Veldhoven (NL); CARL ZEISS AG, Oberkochen (DE)

(*) Notice: Subject to any disclaimer, the term of this patent is extended or adjusted under 35 U.S.C. 154(b) by 0 days.

(21) Appl. No.: 14/147,021

(22) Filed: Jan. 3, 2014

(65) Prior Publication Data

US 2014/0117209 A1 May 1, 2014

Related U.S. Application Data

(63) Continuation of application No. 13/410,875, filed on Mar. 2, 2012, now Pat. No. 8,625,017, which is a
(Continued)

(30) Foreign Application Priority Data

Jan. 31, 2005 (KR) .................. 10-2005-0008654

(51) Int. Cl.
*H01L 27/146* (2006.01)
*H04N 5/335* (2011.01)
(Continued)

(52) U.S. Cl.
CPC .. *H01L 27/14641* (2013.01); *H01L 27/14643* (2013.01); *H04N 5/335* (2013.01); *H04N 5/3559* (2013.01); *H04N 5/3745* (2013.01)

(58) Field of Classification Search
CPC ......... H04N 3/155; H04N 5/378; H04N 5/335
(Continued)

(56) References Cited

U.S. PATENT DOCUMENTS 6,300,977 B1 10/2001 Waechter et al.
6,346,696 B1 2/2002 Kwon
(Continued)

FOREIGN PATENT DOCUMENTS

JP 90-46596 2/1997
JP H11-503283 A 3/1999
(Continued)

OTHER PUBLICATIONS

Notice of Allowance issued in Korean Application No. 10-2006-0132988, mailed Nov. 12, 2007.
(Continued)

*Primary Examiner* — Renee Chavez
(74) *Attorney, Agent, or Firm* — Sterne, Kessler, Goldstein & Fox P.L.L.C.

(57) ABSTRACT

A CMOS image sensor has a pixel array provided with a plurality of unit pixels arranged in a matrix shape of rows and columns. Each of the unit pixels includes a photocharge generation means for generating photocharges by absorbing an external light; and a sensing node for receiving the photocharges transferred from the photocharge generation means, wherein the sensing node of the unit pixel in a previous scan line is shared with a sensing node of a unit pixel in a current scan line in response to a line select signal of the current line.

33 Claims, 4 Drawing Sheets

Related U.S. Application Data continuation of application No. 11/345,207, filed on Jan. 31, 2006, now Pat. No. 8,149,312.

(51) Int. Cl.
*H04N 5/355* (2011.01)
*H04N 5/3745* (2011.01)

(58) Field of Classification Search
USPC ............ 250/208.1; 257/292, 359, 445, 462; 348/241, 294, 300, 302, 308
See application file for complete search history.

(56) References Cited

U.S. PATENT DOCUMENTS

| | | |
|---|---|---|
| 6,452,153 B1 | 9/2002 | Lauxtermann et al. |
| 6,633,334 B1 | 10/2003 | Sakurai et al. |
| 6,759,641 B1 | 7/2004 | Loose |
| 6,995,795 B1 * | 2/2006 | Losee et al. ............... 348/243 |
| 2002/0000508 A1 | 1/2002 | Muramatsu et al. |
| 2002/0024606 A1 | 2/2002 | Yuki et al. |
| 2003/0010896 A1 * | 1/2003 | Kaifu et al. ............... 250/208.1 |
| 2005/0069293 A1 * | 3/2005 | Monoi ........................ 386/95 |
| 2005/0110884 A1 | 5/2005 | Altice, Jr. et al. |
| 2006/0274176 A1 | 12/2006 | Guidash |

FOREIGN PATENT DOCUMENTS

| | | |
|---|---|---|
| JP | 2000-125207 A | 4/2000 |
| JP | 2002-077737 A | 3/2002 |
| JP | 2003-009003 | 1/2003 |
| JP | 2003-134396 | 5/2003 |
| JP | 2004-511137 A | 4/2004 |
| JP | 2006-041866 A | 2/2006 |
| KR | 10-1998-016536 | 6/1998 |
| KR | 10-1999-0084630 | 12/1999 |
| KR | 10-2000-0003346 A | 1/2000 |
| KR | 10-2002-0014315 | 2/2002 |

OTHER PUBLICATIONS

English Translation abstract of KR 10-1999-084630, published Dec. 6, 1999.
English Translation abstract of KR 10-1998-016536, published Jun. 5, 1998.
English Translation abstract of KR 10-2002-0014315, published Feb. 25, 2002.
Japanese Office Action for counterpart Japanese Patent Application No. 2006-001285, dated Aug. 10, 2010 (and English translation).
Japanese Office Action for counterpart Japanese Patent Application No. 2006-001285, dated Nov. 24, 2010 (and English translation).
Computer-generated English translation of JP 2003-009003.
Computer-generated English translation of JP 2003-134396.
Computer-generated English translation of JP 90-46596.
English Language Abstract of Japanese Patent Publication No. JP 2006-041866 A, published Feb. 9, 2006; 2 pages.
English Translation of Notice of Allowance issued in Korean Application No. KR 10-2006-0132988, dated Nov. 12, 2007; 1 page.

* cited by examiner

CMOS IMAGE SENSOR WITH SHARED SENSING NODE

FIELD OF THE INVENTION

The present invention relates to a complementary metal oxide semiconductor (hereinafter, referred to as a CMOS) image sensor; and, more particularly, to a pixel array of a CMOS image sensor for increasing storage capacitance of a sensing node.

DESCRIPTION OF RELATED ARTS

In general, an image sensor is an apparatus for capturing an image using a characteristic of a semiconductor which is sensitive to a light. Every portion of each object existing in nature has different brightness and wavelength so that it shows different electrical values at respective pixels that sense an incident light corresponding to each portion of the object. In this manner, the image sensor serves a role of converting these electrical values into predetermined levels of signals which can be processed through a circuitry.

FIG. 1 is a block diagram setting forth a conventional CMOS image sensor.

Referring to FIG. 1, the conventional CMOS image sensor includes an interface unit 10, a pixel array 20, an analog-digital converter 30 and a buffer 40. Herein, the interface unit 10 controls overall operation of the CMOS image sensor, and acts as an interface with respect to an external system. The pixel array 20 is configured with an N number of pixel columns and an M number of pixel rows to have N×M number of pixels so that the pixel array 20 senses information with regard to an image inputted from an exterior, wherein each pixel is constructed such that its photosensitivity may be maximized. The analog-digital converter 30 converts an analog voltage sensed at each pixel of the image sensor into a digital voltage to be processed at a digital system. The buffer 40 stores the digitalized image data of the pixel in response to the output of the analog-digital converter 30.

In addition, the analog-digital converter 30 is provided with a digital-analog converter (DAC) 31 and a voltage comparator 32. The DAC 31 generates a reference voltage in ramp type which is linearly decreased with a clock, wherein the reference voltage is used for being compared with a voltage sensed at each pixel. The voltage comparator 32 configured with N number of arrangements compares the sensed voltage, i.e., an analog voltage, outputted from the pixel array 20 with the reference voltage of the DAC 31, and outputs a write enable signal which allows a counter value outputted from the interface unit 10 to be written to the buffer 40 while the reference voltage is higher than the sensed voltage.

If the CMOS image sensor employs a correlated double sampling (CDS) method in order to produce high quality image, each unit pixel 100 and 120 of the pixel array is configured with one photodiode and four transistors, as illustrated in FIG. 2. In detail, the four transistors are configured with a transfer transistor M21 for transferring photocharges generated at the photodiode 101 to a sensing node A, a reset transistor M11 for discharging the photocharges stored at the sensing node A in order to detect a next signal, a drive transistor M31 for acting as a source follower, and a select transistor M41 for switching and addressing.

Herein, in the CDS method, a voltage corresponding to a reset level is obtained by turning on the reset transistor M11 but turning off the transfer transistor M21, and subsequently, the photocharges generated at the photodiode 101 are read to obtain a data voltage level by turning off the reset transistor M11 but turning on the transfer transistor M21. Thereafter, a voltage difference between the reset voltage level and the data voltage level is obtained as a pure image data signal.

FIG. 3 is a control timing diagram illustrating signals controlling each transistor in the unit pixel of FIG. 2. Referring to FIG. 3, an operation of the unit pixel will be set forth for every section in detail herebelow.

1) A Section

In this section, the transfer transistor M21 and the reset transistor M11 are turned on, but the select transistor M41 is turned off. Therefore, the photodiode 101 is in a state of a fully depletion.

2) B Section

In this section, the transfer transistor M21 is turned off so that the photodiode 101 absorbs the light to generate the photocharges. Thus, the generated photocharges are integrated during this section. Meanwhile, the section B maintains till the transfer transistor M21 is turned on again regardless of the states of the reset and select transistors M11 and M41.

3) C Section

In this section, the reset transistor M11 is turned on, and the transfer transistor M21 maintains to be turned off, bur the select transistor M41 is turned on so that a reset voltage level is transferred through the drive transistor M31 and the select transistor M41.

4) D Section

In this section, the reset transistor M11 is turned off so as to settle the reset voltage level generated during the section C.

5) E Section

This is a section for sampling the reset voltage level of the section D.

6) F Section

In this section, the reset transistor M11 and the select transistor M41 maintain to be turned off and on, respectively, and the transfer transistor M21 is turned on so that the photocharges integrated at the photodiode 101 during the section B are transferred to the sensing node A. Thus, a data voltage level is transferred through the drive transistor M31 and the select transistor M41.

7) G Section

In this section, the transfer transistor M21 is turned off so as to settle the data voltage level generated during the section F.

8) H Section

This section is for sampling the data voltage level of the section G.

The reset voltage level and the data voltage level which are sampled at the section E and H respectively, are outputted to the analog-digital converter 30 and then, are converted into a digital data. The difference value between the digitally-converted reset voltage level and the data voltage level becomes an output image data of the CMOS image sensor for the image inputted through the photodiode 101.

Herein, the other unit pixels of the conventional CMOS image sensor operate like that of the unit pixel 100 which has been described above. In case of employing a row-by-row scanning type in the pixel array, the scanning is performed from a first row to a last row in sequence.

Therefore, for example, when obtaining a data from a pixel of an nth row after obtaining a data from a pixel of an n−1th row, photocharges are integrated anew after cleaning up all the pixels corresponding to a first to the n−1th rows.

Meanwhile, as described above, the photodiode constituting each unit pixel should have high capacitance for generating the photocharges and integrating them in order to obtain good image quality. To this end, an attempt for improving fill-factor has been made using a technology of increasing a photodiode area and so forth.

However, the sensing node in the conventional CMOS image sensor, which is implemented as a high concentration impurity diffusion region, does not have capacitance enough to receive increased photocharges in spite of the enhanced fill-factor, which makes it difficult to obtain a desired photosensitivity after all.

SUMMARY OF THE INVENTION

It is, therefore, an object of the present invention to provide a CMOS image sensor of which a capacitance of a sensing node is increased by sharing the sensing node of an adjacent non-selected pixel while a selected pixel operates, in order that the sensing node may receive photocharges generated much more due to an enhanced fill-factor.

In accordance with an aspect of the present invention, there is provided A CMOS image sensor having a pixel array provided with a plurality of unit pixels arranged in a matrix shape of rows and columns, each of the unit pixel including: a photocharge generation means for generating photocharges by absorbing an external light; and a sensing node for receiving the photocharges transferred from the photocharge generation means, wherein the sensing node of the unit pixel in a previous scan line is shared with a sensing node of a unit pixel in a current scan line in response to a line select signal of the current line.

In accordance with another aspect of the present invention, there is provided A CMOS image sensor including: a pixel array in which a plurality of unit pixels are arranged in a matrix shape of rows and columns; and a switching means for interconnecting a sensing node of a selected unit pixel to a sensing node of another neighboring unit pixel in response to a select signal, to increase a storage capacitance of the sensing node of the selected pixel. Herein, the unit pixel includes a photocharge generation means for generating photocharges by absorbing an external light; a sensing node for receiving the photocharges transferred from the photocharge generation means; a transfer means for transferring the photocharges from the photocharge generation means to the sensing node; a rest means for resetting the sensing node; an output means for outputting an electric signal in response to the sensing node; and an addressing means of which one side is connected to the output means for switching and addressing in response to the select signal.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A CMOS image sensor with shared sensing node in accordance with exemplary embodiments of the present invention will be described in detail with reference to the accompanying drawings.

Figure 1:
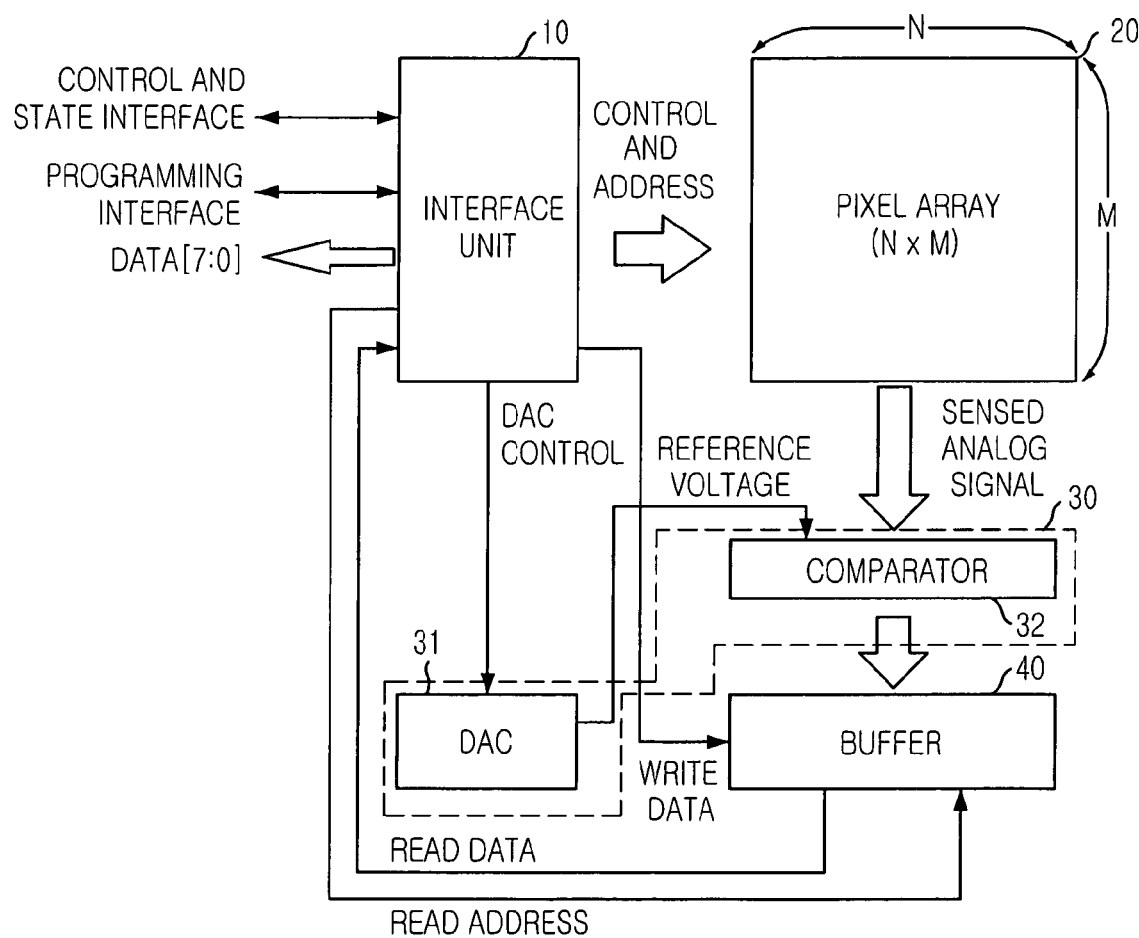
FIG. 1 is a block diagram of a conventional CMOS image sensor.
Figure 2:
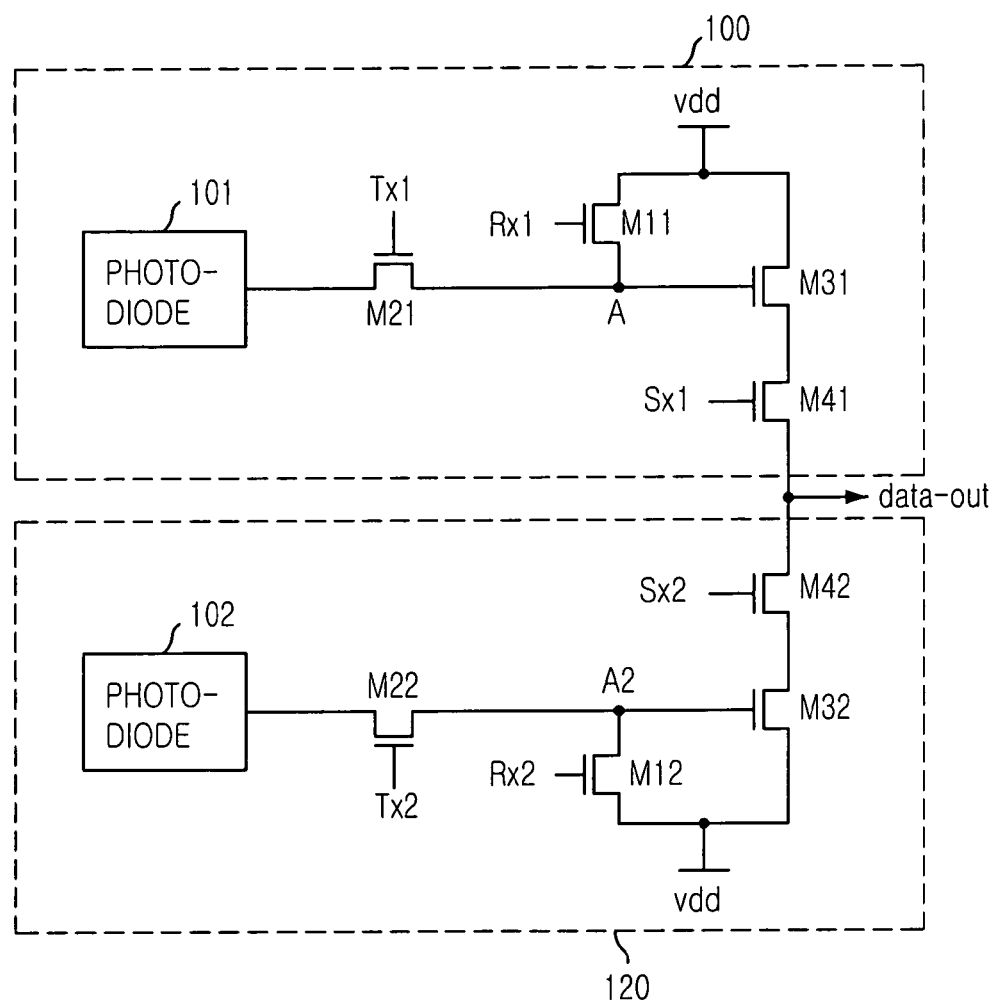
FIG. 2 is a circuit diagram setting forth a pixel array of the conventional CMOS image sensor.
Figure 3:
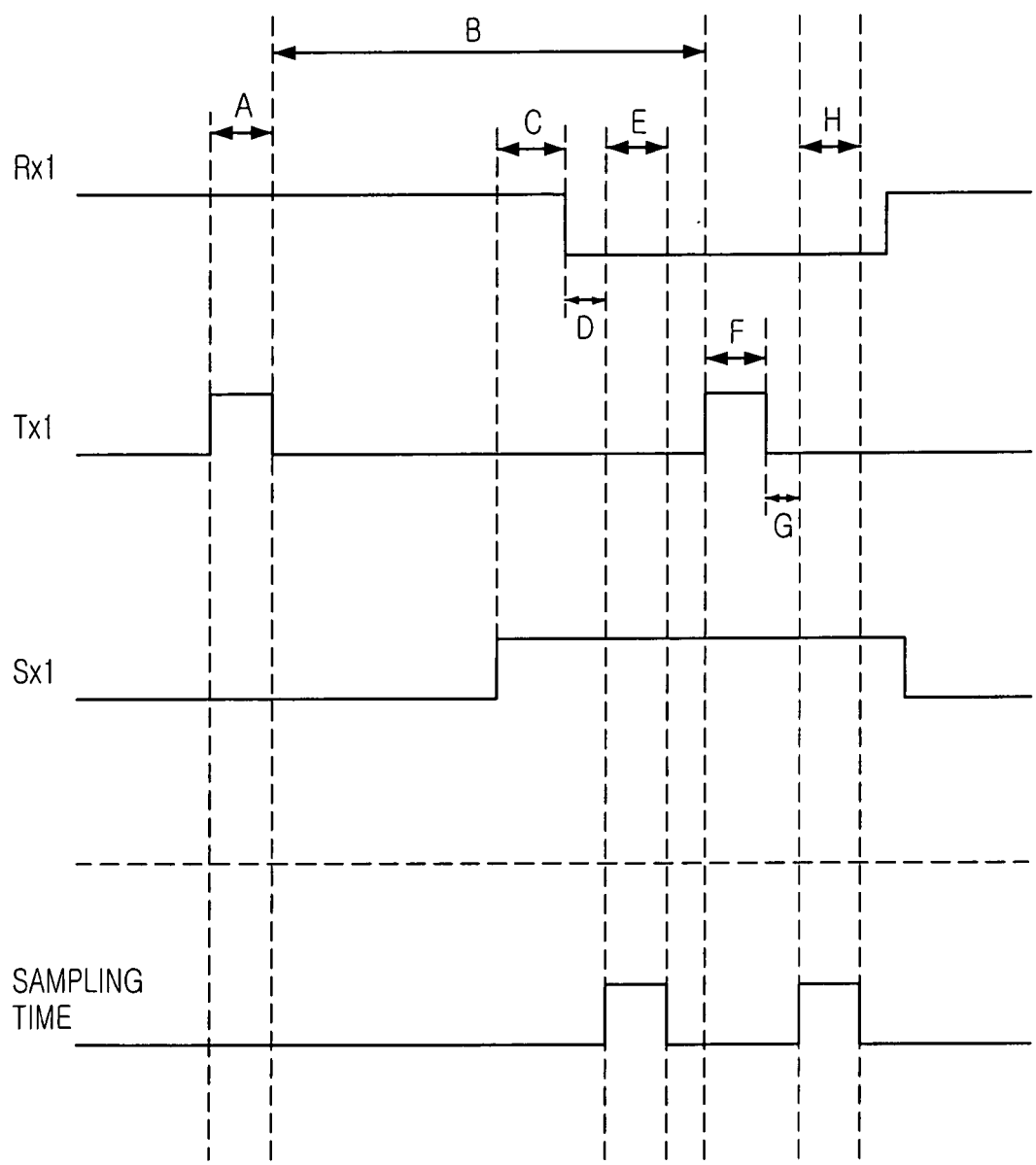
FIG. 3 is a timing diagram setting forth a unit pixel of FIG. 2.
Figure 4:
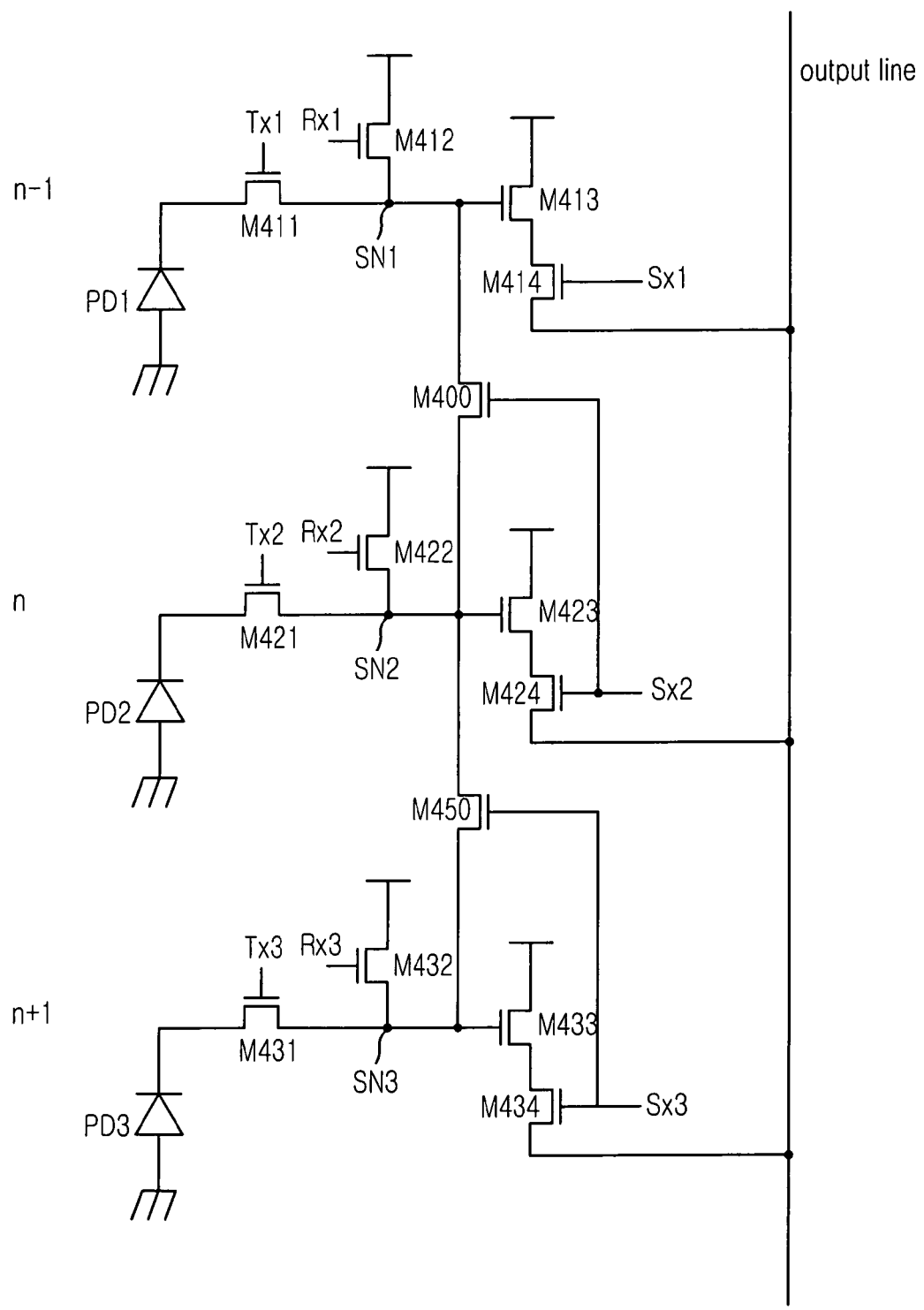
FIG. 4 is a circuit diagram illustrating a pixel array of a CMOS image sensor in accordance with an embodiment of the present invention.

FIG. 4 is a circuit diagram illustrating a pixel array of a CMOS image sensor in accordance with an embodiment of the present invention. In particular, FIG. 4 represents three unit pixels which are successively arranged in the same column among a plurality of unit pixels in the pixel array.

The CMOS image sensor of the present invention is configured with a pixel array in which a plurality of unit pixels are arranged in a column direction and a row direction, like typical constitutions. The CMOS image sensor is driven by a line scanning fashion where a scanning is performed line by line, i.e., row by row or column by column, in sequence. Unlike the prior art, a sensing node SN2 of a pixel in a currently scanning line, e.g., an nth row of FIG. 4, is shared with a sensing node SN1 of a pixel in a lately scanned line, e.g., an n−1th row of FIG. 4, and receives photocharges from a photodiode PD2 of the pixel in the currently scanning line.

FIG. 4 illustrates one embodiment that the line scanning is performed row by row, in which the sensing nodes are shared with a nearest-neighboring pixel arranged in the same column. However, if the line scanning is a column scanning fashion, i.e., scanned column by column, the sensing nodes are shared with a nearest-neighboring pixel arranged in the same row.

The sharing scheme of the sensing nodes is accomplished through a switching device which connects the sensing nodes of the neighboring pixels, wherein the switching device is controlled by a line select signal. To this end, the switching device in the embodiment of FIG. 4 is configured with an NMOS transistor M400 of which a source and a drain are connected between the sensing node SN2 of the selected pixel and the sensing node SN1 of the lately selected pixel, wherein a row select signal SX2 of the currently scanning row is inputted a gate thereof.

Referring to FIG. 4, the CMOS image sensor in accordance with the present invention will be set forth more fully in detail herebelow.

In FIG. 4, it is shown only three unit pixels for the sake of illustrative purpose, which are arranged at intersections of a predetermined one column and an n−1th row, an nth row and an n+1th row, respectively.

Considering the constitutions of the unit pixel of the nth row, the unit pixel includes a photocharge generator PD2 for receiving a light from an object to generate photocharges, a sensing node SN2 for receiving the photocharges from the photocharge generator PD2, a transfer unit M421 for transferring the photocharges from the photocharge generator PD2 to the sensing node SN2, a reset unit M422 for resetting the sensing node SN2, an output unit M423 for outputting an electric signal corresponding to the sensing node SN2, and an addressing unit M424 of which one side is connected to the output unit M423 for switching and addressing in response to a row select signal SX2. Herein, the photocharge generator PD2 is configured with a photodiode. The addressing unit M424 is configured with an NMOS transistor of which one side is connected to the output unit M423 and the other side is connected to an output line. The output unit M423 is configured with an NMOS transistor of which one side is connected to a first power terminal VCC and the other is connected to the addressing unit M424. The reset unit M422 is configured with an NMOS transistor of which one side is connected to the first power terminal VCC and the other side is connected to the sensing node SN2. The transfer unit M421 is configured with an NMOS transistor of which one side is connected to the photocharge generator PD2 and the other is connected to the sensing node SN2.

The unit pixels in the n–1th row and the n+1th row are identical in the constitution to the unit pixel of the nth row. Thus, further descriptions for them will be omitted herein.

In addition, as described above, in order to increase the storage capacitance of the sensing node, the CMOS image sensor of the present invention further includes the switching device M400 and M450 for interconnecting the sensing node of the currently selected pixel to the sensing node of the nearest-neighboring pixel which is lately scanned, in response to the row select signal. In detail, the switching device M400 and M500 is configured with an NMOS transistor of which a source and a drain are connected to the sensing node of the currently selected pixel and the sensing node of the nearest-neighboring pixel which is lately scanned, wherein the row select signal is inputted to a gate thereof.

For example, if the unit pixel of the nth row is being scanned now, the sensing node SN1 of the unit pixel in the n–1th row which has been scanned lately and the sensing node SN2 of the unit pixel in the nth row are shared with each other so as to receive the photocharges from the photodiode PD2 of the unit pixel in the nth row.

As stated above, since the CMOS image sensor of the present invention shares the sensing node of the nearest-neighboring unit pixel of a non-selected line when the specific unit pixel of a selected line is operating, it is possible to receive much more photocharges generated due to the enhanced fill-factor. That is, the storage capacitance of the sensing node is increased in virtue of the sharing scheme of the sensing node between nearest-neighboring pixels so that it is possible to implement a high quality CMOS image sensor.

The present application contains subject matter related to the Korean patent application No. KR 2005-08654, filed in the Korean Patent Office on Jan. 31, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method, comprising:
   generating photocharge at a first pixel of an image sensor, the first pixel having a transfer transistor and a first sensing node for storing the photocharge connected to the transfer transistor, the image sensor also having a second pixel having a second sensing node for storing photocharge;
   electrically coupling the first sensing node and the second sensing node;
   transferring the photocharge generated at the first pixel to the first sensing node of the first pixel via the transfer transistor and to the second sensing node of the second pixel of the image sensor, wherein the first pixel is in a first line and the second pixel is in a second line adjacent to the first line; and
   generating, based on the photocharge transferred to the first sensing node and the second sensing node, an output signal that is indicative of the photocharge generated at the first pixel.

2. The method of claim 1, wherein the transferring is performed in response to one or more select signals.

3. The method of claim 1, wherein the electrically coupling comprises selectively electrically coupling the first sensing node to the second sensing node prior to said transferring.

4. The method of claim 1, further comprising:
   after said generating an output signal, decoupling the first sensing node from the second sensing node and electrically coupling the second sensing node to a third sensing node of a third pixel of the image sensor;
   transferring photocharge generated by the third pixel to the second sensing node and the third sensing node; and
   generating, based on photocharge transferred to the second sensing node and the third sensing node, another output signal that is indicative of the photocharge generated at the third pixel.

5. The method of claim 1, comprising:
   applying a select signal to a gate of a transistor providing a source/drain pathway between the first sensing node and the second sensing node prior to said transferring; and
   turning on the transistor and electrically coupling the first sensing node to the second sensing node in response to said applying.

6. The method of claim 1, further comprising resetting the first sensing node and the second sensing node to a reset level in response a reset signal for the first pixel.

7. The method of claim 1, further comprising:
   applying a select signal to a gate of a select transistor; and
   turning on the select transistor and transferring the output signal to an output line in response to said applying.

8. The method of claim 1, wherein providing an image sensor comprises providing a CMOS sensor.

9. A method, comprising:
   producing photocharge with a first pixel of an image sensor in response to receiving light with the first pixel, the first pixel having a transfer transistor and a first sensing node connected to the transfer transistor;
   selectively electrically coupling the first sensing node of the first pixel to a second sensing node of a second pixel of the image sensor, wherein the first pixel is in an $n^{th}$ line and the second pixel is in an $n-1^{th}$ line; and
   receiving the photocharge at the first sensing node and the second sensing node.

10. The method of claim 9, further comprising generating, based on the photocharge received by the first sensing node and the second sensing node, an output signal indicative of light received by the first pixel.

11. The method of claim 9, further comprising scanning, row-by-row, using the image sensor, the image sensor comprising rows of image sensor pixels to generate output signals indicative of light received by the rows of image sensor pixels, wherein said scanning comprises:
   in response to scanning a row of image sensor pixels that includes the first pixel, generating, based on the photocharge received by the first sensing node and the second sensing node, an output signal indicative of light received by the first pixel; and
   in response to scanning a previous row of image sensor pixels that includes the second pixel, generating another output signal indicative of light received by the second pixel.

12. The method of claim 11, wherein said scanning the row of image sensor pixels that includes the first pixel occurs after said scanning the previous row of image sensor pixels that includes the second pixel.

13. The method of claim 9, further comprising generating a row select signal that selects a row of image sensor pixels that includes the first pixel, wherein said selectively electrically coupling occurs in response to the row select signal.

14. The method of claim 9, further comprising scanning, column-by-column, using the image sensor, the image sensor comprising columns of image sensor pixels to generate output signals indicative of light received by the columns of image sensor pixels, wherein said scanning comprises:
   in response to scanning a column of image sensor pixels that includes the first pixel, generating, based on the photocharge received by the first sensing node and the second sensing node, an output signal indicative of light received by the first pixel; and
   in response to scanning a previous column of image sensor pixels that includes the second pixel, generating another output signal indicative of light received by the second pixel.

15. The method of claim 14, wherein said scanning the column of image sensor pixels that includes the first pixel occurs after said scanning the previous column of image sensor pixels that includes the second pixel.

16. The method of claim 9, wherein providing an image sensor comprises providing a CMOS sensor.

17. A method, comprising:
   integrating photocharge with a pixel array that includes a plurality of sensing pixels arranged in a matrix of rows and columns;
   selecting a first row of sensing pixels from the plurality of sensing pixels in response to a select signal;
   connecting a first sensing node of a first sensing pixel in the first row with a second sensing node of a second sensing pixel in a second row of sensing pixels in response to the select signal;
   transferring photocharge from a photodiode of the first sensing pixel to both the first sensing node and the second sensing node; and
   generating an output signal indicative of the photocharge transferred to the first sensing node and the second sensing node.

18. The method of claim 17, further comprising after said generating an output signal, selecting a third row of sensing pixels from the plurality of sensing pixels in response to another select signal; connecting a third sensing node of a third sensing pixel in the third row with the first sensing node in the first row in response to the other select signal;
   transferring photocharge from another photodiode of the third sensing pixel to both the first sensing node and the third sensing node; and
   generating another output signal indicative of the photocharge transferred to the first sensing node and the third sensing node.

19. The method of claim 17, wherein said connecting comprises: applying the select signal to a gate of a transistor providing a source/drain pathway between the first sensing node and the second sensing node; and turning on the transistor in response to said applying.

20. The method of claim 17, further comprising resetting the first sensing node and the second sensing node to a reset level in response to a reset signal for the first sensing pixel.

21. The method of claim 17, further comprising:
   applying a reset signal to a gate of a reset transistor providing a source/drain pathway between a first power terminal and the first sensing node; and
   turning on the reset transistor and resetting the first sensing node and the second sensing node to a reset level in response to said applying.

22. The method of claim 17, further comprising:
   applying the select signal to a gate of a select transistor; and
   turning on the select transistor and transferring the output signal to an output line in response to said applying.

23. The method of claim 17, wherein the first sensing node of the first sensing pixel is connected to a transfer transistor of the first sensing pixel.

24. A method, comprising:
   integrating photocharge with a pixel array that includes a plurality of sensing pixels arranged in a matrix of rows and columns;
   selecting a first row of sensing pixels from the plurality of sensing pixels by activating an addressing unit;
   selectively electrically coupling a first sensing node of a first sensing pixel in the first row with a second sensing node of a second sensing pixel in a second row of sensing pixels by activating a switching device;
   transferring photocharge from a photodiode of the first sensing pixel to both the first sensing node and the second sensing node; and
   generating an output signal indicative of the photocharge transferred to the first sensing node and the second sensing node.

25. The method of claim 24, wherein the addressing unit and the switching device are activated in response to a common signal.

26. The method of claim 25, wherein the common signal is inputted to the addressing unit and the switching device.

27. The method of claim 26, wherein the addressing unit and the switching device are MOS transistors.

28. The method of claim 27, wherein the common signal is inputted to the respective gates of the addressing unit and the switching device.

29. The method of claim 25, wherein the common signal is a row select signal.

30. An imaging system comprising:
   an image sensor; and
   an external system in communication with the image sensor, wherein the external system comprises a control interface and a data interface, the external system configured to generate signals that control the operation of said image sensor via the control interface;
   wherein said image sensor comprises:
      an interface unit in communication with said external system to control operation of the image sensor; and
      a pixel array having a first pixel with a first sensing node for receiving photocharge, the first sensing node being coupled to a transfer transistor, and a second pixel with a second sensing node for receiving photocharge, the second sensing node being coupled to the transfer transistor, wherein the first pixel is in a first line and the second pixel is in a second line adjacent to the first line, wherein the pixel array is configured to:
         generate photocharge at the first pixel,
         transfer the photocharge generated at the first pixel to the first sensing node and to the second sensing node via at least the transfer transistor; and
         generate, based on the photocharge transferred to the first sensing node and the second sensing node, an output signal that is indicative of the photocharge generated at the first pixel.

31. The system of claim 30, wherein the external system receives image data from the image sensor via the data interface.

32. The system of claim 30, further comprising a clock providing one or more timing signals to the image sensor.

33. The imaging system of claim 30, wherein the imaging sensor comprises a CMOS sensor.

\* \* \* \* \*